United States Patent [19]

Jones, Jr. et al.

[11] Patent Number: 5,267,395
[45] Date of Patent: Dec. 7, 1993

[54] BURN-IN BOARD LIF UNLOADER SYSTEM AND METHOD

[75] Inventors: Arthur T. Jones, Jr.; William C. Layer, both of Boise, Id.

[73] Assignee: Micron Semiconductor, Inc., Boise, Id.

[21] Appl. No.: 997

[22] Filed: Jan. 6, 1993

[51] Int. Cl.⁵ .......................... H05K 3/00; B23P 19/00
[52] U.S. Cl. ...................... 29/829; 29/426.3; 29/426.5; 29/741; 29/762; 209/573
[58] Field of Search ................. 29/829, 834, 741, 762, 29/426.3, 426.5; 209/573

[56] References Cited

U.S. PATENT DOCUMENTS

| | | | |
|---|---|---|---|
| 3,727,757 | 4/1973 | Boissicat | 209/573 |
| 4,234,418 | 11/1980 | Boissicat | 29/241 X |
| 4,250,615 | 2/1981 | Knuth et al. | 29/834 X |
| 4,304,514 | 12/1981 | Pfaff | 29/741 X |
| 4,439,917 | 4/1984 | Pearson | 29/741 X |
| 4,660,282 | 4/1987 | Pfaff | 209/829 |
| 5,214,849 | 6/1993 | Jones, Jr. | 29/762 |

Primary Examiner—Carl J. Arbes
Attorney, Agent, or Firm—Wayne E. Duffy

[57] ABSTRACT

The inventive apparatus is to provide rapid, automatic separation, classification and operator assisted dispensation of integrated circuit assemblies from burn-in and device under test boards to which they are attached. The apparatus is computer controlled, with an electronic control panel, and is assembled to differentiate between and separate physically acceptable and unacceptable integrated circuit assemblies and deliver, by means of a suitable reservoir, the acceptable assemblies to appropriate carrier tubes for further processing or shipping. The system uses an indexing table to move an inverted device under test board across an array of assembly extraction fingers which remove attached integrated circuit assemblies from the sockets of the test board and drop them into a reservoir. The reservoir is slotted to receive the individual assemblies and dispense them into carrier tubes. Several position sensing means are included in the system to provide automatic control of the indexing table, the assembly extraction fingers and the reservoir during the operation of the system.

5 Claims, 4 Drawing Sheets

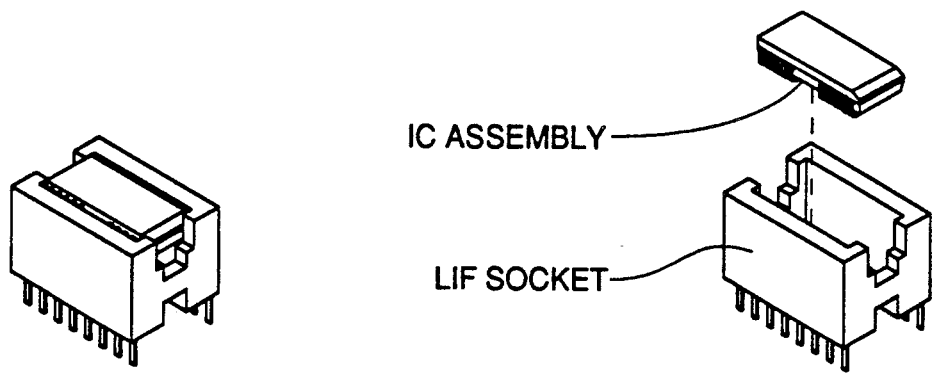
FIG. 2
(RELATED ART)
FIG. 3
(RELATED ART)
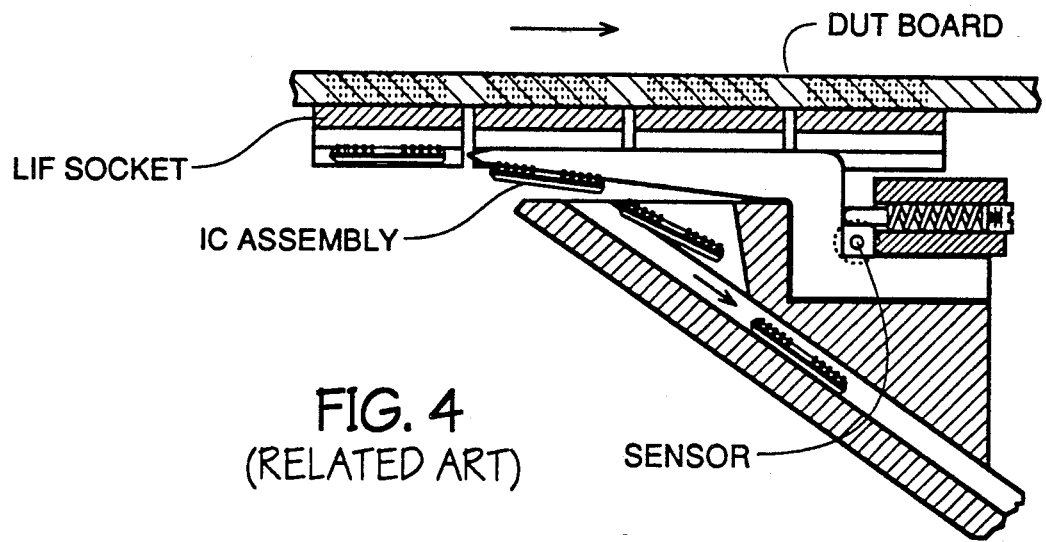
FIG. 4
(RELATED ART)
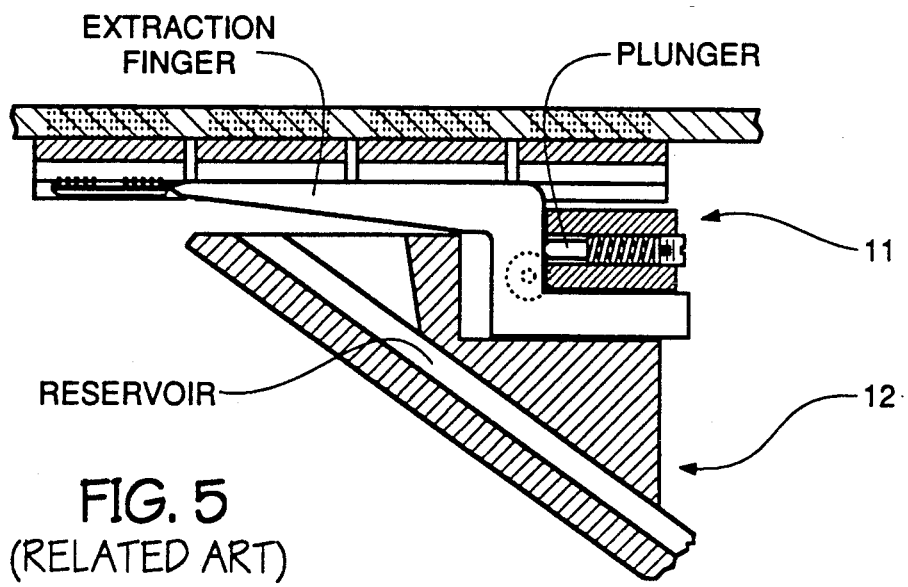
FIG. 5
(RELATED ART)

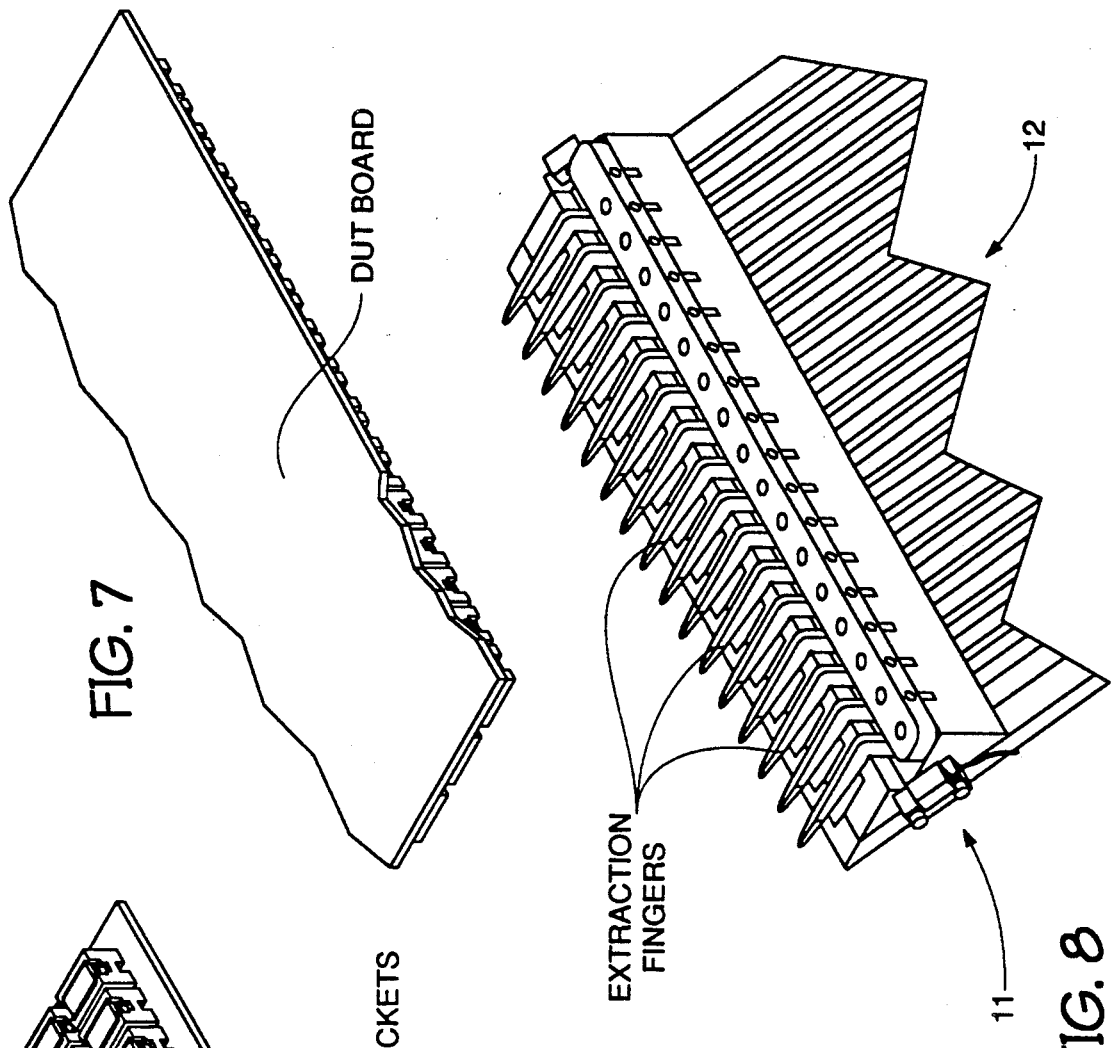
FIG. 7
FIG. 8
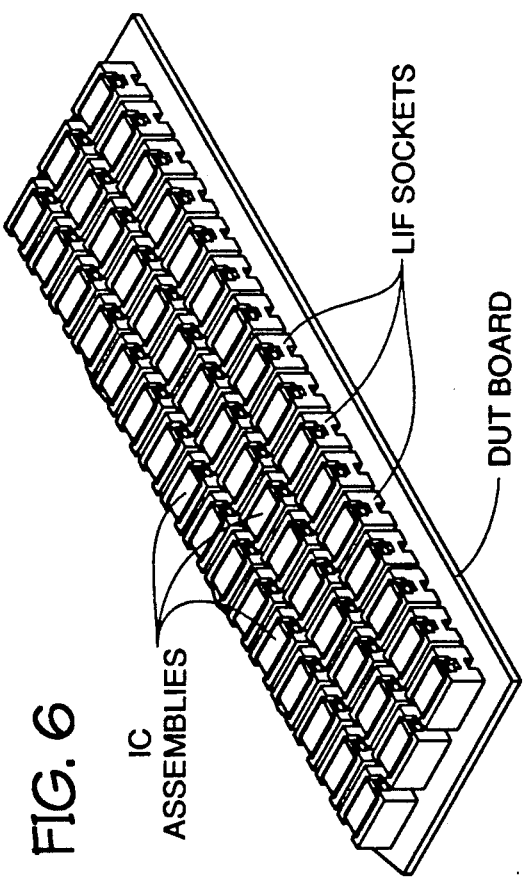
FIG. 6

BURN-IN BOARD LIF UNLOADER SYSTEM AND METHOD

BACKGROUND OF THE INVENTION

1. Field of the Invention

This invention relates to an integrated and automated system for the rapid removal of integrated circuit (IC) assemblies from a burn-in board or other device under test (DUT) board which will differentiate between and separate physically acceptable and unacceptable IC assemblies and dispense the acceptable IC assemblies into suitable IC carriers for further processing or shipping.

2. Prior Art

This invention is designed to implement and be used in conjunction with a newly developed "Integrated Circuit Removal Apparatus", U.S. Pat. No. 5,214,849. It use is not limited to this application and other applications may be obvious to those skilled in the art.

Two other IC assembly removal systems are notable in prior art. One system, called the UNloader (TM), is produced by Reliability, Incorporated of Houston, Tex. In its several models it provides a rapid means for removing IC assemblies from sockets on burn-in boards. It uses a low angle, wedge shaped extractor to disengage the assemblies from the sockets on the boards. The assemblies are then held in reservoirs at the base of each extractor until release into IC carrier tubes.

A second IC assembly removal system is manufactured by IDEA, Incorporated of Torrance, Calif. This employs an insertion means which uses a finger to fit into the groove in the burn-in socket between the socket and the assembly to allow for perpendicular removal of the assembly.

Neither of the two systems appears to have the automatic features to be described in this invention nor do they have the ability to automatically distinguish and separate physically acceptable from unacceptable IC assemblies prior to loading them into carrier tubes.

SUMMARY OF THE INVENTION

The IC assembly unloader system described herein is designed to implement and support an automated apparatus developed at this facility to rapidly and automatically remove, identify and separate a plurality of IC assemblies from a burn-in board or DUT board. The IC assembly removal apparatus mentioned previously, is designed to extract the IC assemblies from the sockets of the test board with a minimum of force to reduce the likelihood of damage to the assemblies and the implementing means and system described herein are similarly designed to control the force used in the IC assembly unloading system. The burn-in boards and other DUT boards are commercially available and are designed in a standard and known way to require a low insertion force when the IC assemblies are placed in the removable sockets on the test boards. Conversely the extraction force required to remove the IC assemblies from the test board sockets is low.

This burn-in board unloader system for low insertion force sockets, hereinafter designated as the Low Insertion Force (LIF) Unloader, removes IC assemblies from a device under test (DUT) board and collects the assemblies in a reservoir. In this system a loaded DUT board is inverted, with the IC leads facing up, and secured to the underside of an indexing table. This table is removably and movably mounted above and proximate and parallel to the upper planar surfaces of the IC assembly removal apparatus previously mentioned.

When the operator commences automatic operation of the system the LIF Unloader automatically moves the indexing table back, by operably connected mechanical means, in a parallel plane, until the loaded DUT board clears the front ends of the IC reservoir and the fingers of the IC assembly removal apparatus. The reservoir and the extraction finger assembly then automatically lifts up, in touching contact with the IC assemblies and the board sockets and the indexing table is indexed forward automatically to begin unloading the DUT board. The extracting fingers slide between the IC assemblies and the sockets, wedging the assemblies out of their respective sockets. The separated assemblies then slide down by gravity into an array of parallel reservoirs which match each parallel row of IC assemblies which are being detached from the DUT board.

If an IC assembly is jammed in its socket or the socket is misaligned in the DUT board the affected extraction finger will be caused to moved backward and activate a finger position sensor. The sensor then commands the indexing table to stop its forward movement and so informs the operator. The indexing table containing the DUT board is then lifted manually by the operator and the jammed IC assembly is removed. The indexing table is then lowered automatically to its operating position and the position sensor instructs the indexing table to continue its forward movement. When the separated IC assemblies have accumulated to a preselected point in any slot of the array of reservoirs, the unloader is designed to stop and inform the operator of the condition. The operator then inserts IC assembly carrier tubes into the bottom ends of the reservoirs and a predetermined number of IC assemblies drop into the tubes. After the DUT board is unloaded the operational cycle is repeated for another DUT board.

DESCRIPTION OF THE DRAWINGS

FIG. 2 through 8 show related art.

DESCRIPTION OF THE PREFERRED EMBODIMENT

Figure 1:
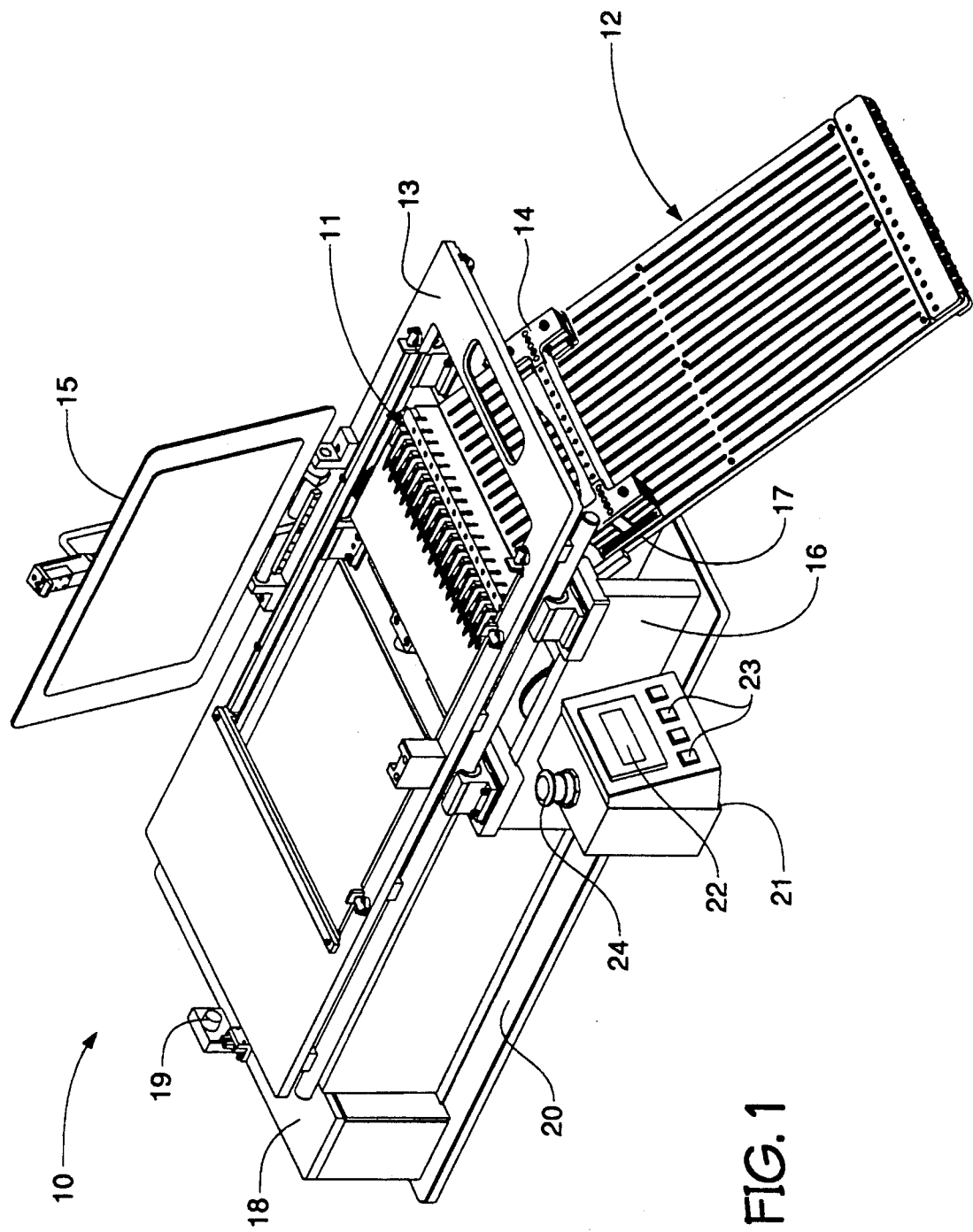
FIG. 1 is an isometric view of the LIF Unloader system.

FIG. 1 shows an isometric view of the preferred embodiment described below and is generally designated by the numeral 10. The automated, low insertion force (LIF), integrated circuit assembly (IC) rapid removal system for use with burn-in or device under test (DUT) boards, is comprised of ten principal sub-assemblies which include, where appropriate, standard, commercially available, electrical, pneumatic and mechanical components. These sub-assemblies are functionally combined and operated in such a manner as to rapidly and automatically remove IC assemblies from a DUT board and collect the separated assemblies in a slotted reservoir. When the IC assemblies have been accumulated to a preselected point in each of the slots of the reservoir, the unloader will stop automatically and inform the operator that the reservoir is full. The operator can then insert IC assembly carrier tubes into the ends of the reservoir slots, where the IC assemblies will slide into the tubes. The filled tubes will then be removed and be replaced by empty tubes for the next operation cycle of the system.

As mentioned previously, the LIF unloader system was created and designed to augment and implement a new and improved IC removal apparatus which is illustrated in FIGS. 2 through 8, with particular attention to FIGS. 4, 5, 6 and 8. The IC removal apparatus is considered related art, disclosed in U.S. Pat. No. 5,214,894. It, or a similar apparatus is essential to the usefulness of this integrated circuit, low force unloader system and is identified as the extraction finger mount assembly 11 in FIG. 1. The extraction fingers physically remove the IC assemblies from the sockets on the DUT board, shown in FIGS. 3, 4, 5, and 8 and feed them into the reservoir assembly 12 as the DUT board travels across the finger mount assembly 11. The index plate (platen) 13 carries the inverted DUT board, as shown in FIG. 8, across the extraction finger mount assembly. The upper part stop assembly 14, which includes the stop sensor means, is fixed to the surface of the reservoir assembly 12 and controls the number of IC assemblies that are removed from the reservoir and placed into the IC carrier tubes (not shown). The board clamp assembly 15 is rectangularly shaped to generally match the external dimensions of the DUT board and is hingably attached to one side of the index plate assembly. When closed it serves to hold the DUT board securely on the index plate while the index plate is moving forward during the removal of the IC assemblies by the extraction fingers. The bearing rail assembly 16 extends across the front end of the unloader, below the extraction finger assembly and the reservoir assembly and contains empowering means (not shown) for movement of the index plate and reservoir assemblies. The reservoir mount assembly 17 supports the reservoir assembly. The backplate assembly 18 is generally box shaped, is located at the rear of the bearing rail assembly and supports the air regulator and related pneumatic components (not shown) and an index plate stop and position sensor means 19. The baseplate assembly 20 consists of a generally rectangular plate which supports and holds the various assemblies of the system. The control panel assembly 21 is attached to one side of the bearing rail assembly and serves as an interface between the operator and the CPU (not shown) of the unloader system. It starts and stops the unloader and displays error messages, statistics and diagnostic messages which will discussed later.

The LIF unloader system, in this preferred embodiment, consists of standard, commercially available mechanical, pneumatic and electronic components whose functions will be generally described but not shown in detail. None of the empowering components operably connected to the various assemblies is unique and is not considered a novel part of this invention. A drive shaft and clutch combination moves the index plate assembly. A pneumatic clutch links the drive shaft to the index plate assembly drive gear.

The upper part stop, clutch and reservoir motion are all pneumatically controlled. Three electrically activated solenoids control air flow to each assembly.

The LIF unloader system is computer controlled. Machine status is monitored by means of light beam sensors and interrupt and hall effect sensors. An electric motor powers the LIF unloader with the help of a motor controller. Minimum installation requirements for this preferred embodiment include 110 VAC, 10 amperes, 60 Hz of power; 60 psi, 5 cfm of dry air; a table to support the system.

A CPU regulates the motor and motor controller along with the pneumatics. A LCD display with four color coded buttons are located on the control panel which is attached to the side of the bearing rail assembly. The specific functions of the individual buttons will be described later. Various sensors, to be described, indicate the following conditions: fingerjam, reservoir full, reservoir up/down, index table limits.

The finger jam detector uses a photoelectric sensor to detect problems unloading the IC assemblies from the burn-in board sockets. The extraction fingers, which dislodge the assemblies from their sockets, use a spring loaded ball plunger to keep pressure on the finger while it slides between the assembly and the socket. The plunger acts as a cushion should the finger happen to hit a solid object such as the socket or a misaligned assembly. As the finger is pushed back against the ball plunger, the beam of the photoelectric sensor is broken. This seen by the CPU which will tell the motor controller to stop the unloader and show an error message on the LCD display. These sensors use an adjustable amplifier which can change the sensitivity of the sensor. The finger U.S. Pat. No. 5,214,849 and is not a part of this invention, although augmented and implemented by this invention.

The upper part stop sensor (not shown) which is included in the upper parts stop assembly 14, uses the same type of photoelectric sensor as the finger jam condition. The beam runs through the reservoir, detecting when parts have accumulated up to the upper part stop sensor. When the parts block the beam, a signal is sent to the CPU which tells the upper part stop hardware to block the reservoir channels. At the same time the CPU also instructs the unloader to stop and display a message on the LCD. The upper part stop assembly may be physically moved up or down the reservoir to adjust the amount of parts held in the reservoir before the unloader is shutdown.

Two Hall Effect sensors (not shown) are magnetically activated by the piston of the reservoir lift cylinder. The sensors are mounted onto the lift cylinder itself then are wired to the CPU. They communicate to the CPU when the reservoir is completely up or completely down. This prevents problems due to the vertical positioning of the reservoir and extraction fingers. An error message is displayed if the correct sensor is not triggered at the right time.

Two interrupt flag sensors (not shown) are used to restrict the travel of the index plate assembly. The start sensor is activated by a metal flag on the back of the index plate, breaking the through beam of the sensor as it travels back after the start button has been depressed. This informs the CPU to raise the reservoir and begin moving the index plate assembly in the opposite direction to unload the DUT board. Once the unloader is finished, a metal flag on the back of the index plate breaks the beam of the stop flag sensor mounted toward the front of the unloader. The CPU stops the index plate and lowers the reservoir.

The pneumatics on the unloader system use solenoids to transfer airflow to different areas. The solenoids have one pneumatic input and two outputs. They also have an electrical input connected to the CPU which dictates when an output will be used. Compressed air is sent to the clutch, reservoir lift cylinder and upper part stop.

Compressed air flows through a filter and pressure gauge to the clutch solenoid which has one output going to the clutch and the other output plugged. Once the start button is pressed, an electronic signal from the CPU switches the flow of air from the plugged output to the clutch output, sending 60 psi to the clutch. The air is sent down a line to a rotating manifold and centering block. The air pressure pushes out the clutch piston, applying pressure to the idler shaft drive gear, which is meshed with the drive shaft and is always rotating when the motor is running. The idler shaft drive gear, pressed by the piston, applies pressure to a round leather washer which grips and turn the idler shaft index gear. This gear then rotates the index plate drive gear which meshes with the index gear rack, located on the bottom of the index plate, forcing the index plate outward.

The clutch assembly serves an important purpose. When the unloader is turned off and the clutch is disengaged, the index plate can be pushed in or pulled out without turning all of the gears, including the motor. Both table gears are free when the leather washer does not have pressure against the idler shaft index gear.

Compressed air is sent from the incoming regulator through the lift cylinder solenoid which has one output connected to the cylinder's top chamber and the other output connected to the cylinder's bottom chamber. When the unloader is activated, the CPU sends a signal to the solenoid which allows the compressed air to travel to the lift cylinder's bottom chamber. This raises the cylinder, thus raising the reservoir and extraction fingers, placing them in position to remove the IC assemblies. When the unloader is stopped, the CPU tells the solenoid to switch the airflow to the output going to the lift cylinder's top chamber. This pushes the cylinder down, which lowers the reservoir and extraction fingers.

The upper part stop sensor is located on the upper part stop hardware. When this sensor is blocked, the CPU sends an electronic signal to the upper part stop solenoid. This sends compressed air to the top chamber of four small air cylinders which lowers the upper part stop blocking each channel of the reservoir. Once the parts in the reservoir are removed and placed in tubes, the upper part stop sensor is no longer blocked. The CPU then sends a signal to the solenoid changing the pneumatic output. Air now travels to the bottom chambers of the four cylinders, which raise the upper part stop, allowing IC assemblies to slide into the reservoir until this sensor is again blocked.

As mentioned previously, the LIF unloader system is regulated by a control panel attached to the side of the unloader. The control panel consists of an LCD screen 22 with four color coded push buttons 23 for use in the general operation of the LIF unloader. The emergency stop pushbutton 24, found on top of the control panel, disconnects all power to the pneumatic solenoids and the motor.

The unloader system is ready for operation once it is plugged into electrical power, the proper air pressure is applied and the emergency stop button is released.

The operational procedure of the preferred embodiment of the Burn-in Board Low Insertion Force Unloader System and which implements the newly developed, aforementioned integrated circuit removal apparatus, disclosed in U.S. Pat. No. 5,214,849, will be described briefly:

1. Turn on appropriate electrical power, activate pneumatic air pressure and release emergency stop button on the system.

2. Position the index plate assembly. Pull the index plate manually forward, toward the reservoir assembly, until it is fully extended.

3. Place a loaded DUT board on the index plate and secure it thereto, with the board sockets facing downward and appropriately oriented toward the front of the Unloader, with the ends and sides of the board being indexed precisely to the index plate to obtain accurate alignment with the extraction fingers during the IC assembly removal step (not shown). The board clamp assembly is then lowered manually, locking the board into position (not shown).

4. Press appropriate button on the control panel to unload the DUT board. First the index plate moves automatically to the rear of the unloader until it comes to rest against the rear stop mount. The reservoir and the finger mount assembly then rise into extraction position. The index plate then moves in a controlled manner across the finger mount assembly while the extraction fingers sequentially remove the IC assemblies from the DUT board sockets. The index plate continues to move forward until it reaches the forward stop sensor. The LCD display will indicate that the DUT board has stopped and that the IC removal is complete for that board.

5. Remove and replace the DUT board. Unlock the board clamp, remove the empty DUT board and secure a new board to the index plate. The appropriate button on the control panel is then pressed and the reservoir and finger mount assembly lower, enabling the index plate to automatically roll back to the starting position so that the extraction process can be repeated on the new DUT board.

When the IC assemblies in any one of the slotted accumulate to the upper part stop position the unloader will stop. The upper part stop assembly will clamp down and block any assembly located above the stop position (not shown). At this point the operator will insert IC assembly carrier tubes into tube clamps (not shown) located at the bottom of the reservoir and the assemblies will slide from the reservoir into the carrier tubes. The tubes will remain in position until they are filled and then will be removed, to be replaced by empty tubes, when required.

The unloader is then restarted by pressing the appropriate button on the control panel, which causes the upper part stop to rise, allowing the excess assemblies to slide to the bottom of the reservoir. The index plate then resumes normal operation.

During the operation of the Burn-in Board LIF Unloader System some type of mechanical jamming of the IC assembly separation process or the reservoir storing process may occur. A novel feature of this system is the ability to automatically detect, define and classify the nature of the jam and to stop the operation of the system until the problem can be corrected by the operator, thereby preventing damage either to the system or to the IC assemblies and board sockets being processed. After the problem is corrected the normal operation of the system is resumed.

There are three types of jams which are commonly encountered: 1. finger jam of the extraction finger against a jammed IC assembly or misaligned DUT board socket; 2. table jam of the assembly after it has been separated from the board socket and blocks the entrance of the reservoir into which it is supposed to drop; 3. reservoir jam, which is indicated when the reservoir is not fully in the up or down position. Each of these jams must be corrected by the operator before normal operation of the system may be resumed. Specific steps may be taken by the operator to resolve the problems described above. The problems which arise usually are detected by visual inspection by the operator after appropriate signals are emitted by the system. The appropriate remedial steps are summarized in FIG. 9 which shows the operational logic of the system. Other procedures are discussed in the text immediately preceding this and in the Summary of the Invention.

The preferred embodiment of the LIF unloader system also has a standard diagnostic mode to aid in troubleshooting, a LCD display of sensor status and solenoid functionality and a statistics mode to estimate the number of assemblies unloaded by recording the number of boards unloaded and the number of full reservoirs emptied. The statistics mode can also be used to monitor the number of finger, table and reservoir jams that occur to indicate possible adjustments to the unloader system. These are obvious features which serve to make the system more convenient and useful but are not considered to be novel or essential to this invention (not shown).

Figure 9:
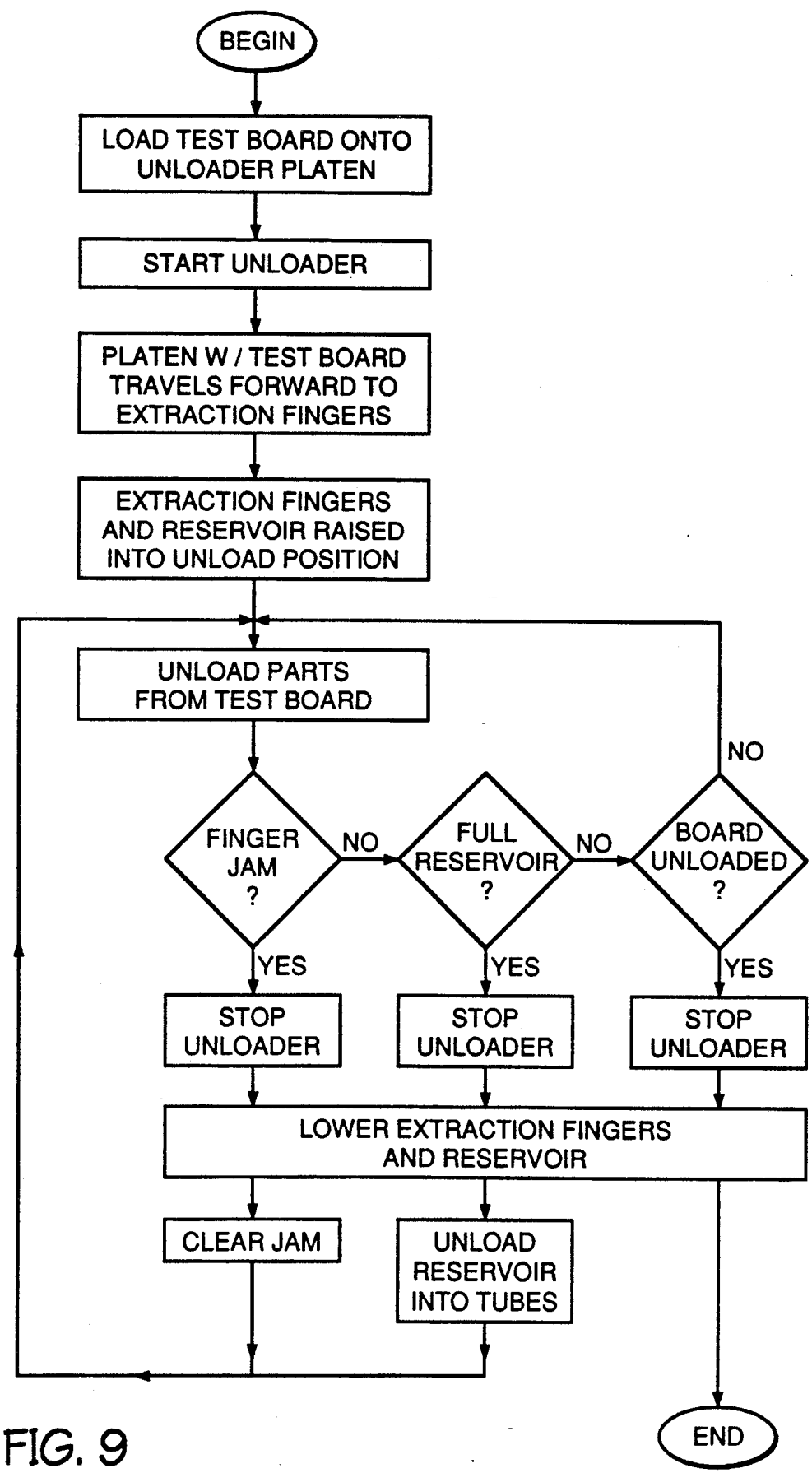
FIG. 9 shows the operational logic of the LIF Unloader System.

The LIF Unloader system operational logic is summarized in FIG. 9.

The present invention has been described in a preferred embodiment which is designed to augment and implement related art. Modifications and variations may become apparent to those skilled in the art, particularly as disclosed in U.S. Pat. No. 5,214,849. However the scope of the invention is not limited by the above described detail but only by the appended claims.

We claim:

1. A method for the use of an improved, integrated and computer controlled machine having operating elements for receiving multiple integrated circuit (IC) assemblies that are individually and removably attached to a device under test (DUT) board and distinguishing between and separating the physically acceptable and unacceptable IC and discharging the acceptable IC into a reservoir and delivering them into suitable carriers, comprising:

a) providing a programmed and computer controlled and integrated system with operator interface and control and with appropriate interconnection and feedback between the various operating elements of the machine for automatic and manual inspecting and monitoring and controlling the location and orientation and acceptability of the IC assemblies and the operating of the machine system during the execution of the method;

b) activating and checking all of the operating elements of the machine system designated to employ said method and making any necessary adjustments;

c) attaching and securing a properly aligned and loaded DUT board to a movable indexing table which is operably connected and properly oriented and located proximate to an existing IC extraction apparatus;

d) moving said indexing table by controllable means so that said DUT board and attached parallel rows of IC pass across a properly aligned and matching array of IC assembly spring loaded extraction fingers;

e) disengaging and separating and removing the IC assemblies from the DUT board by allowing said spring loaded fingers to slide into parallel matching slots between the standard test board sockets and the attached IC assemblies;

f) dropping the loosened IC assemblies into parallel, matching, down sloping storage reservoirs;

g) transferring said IC assemblies into suitable carrier tubes for further processing and shipping;

h) returning said indexing table and attached DUT board to the starting position and removing said DUT board;

i) sensing the respective positions of the indexing table at the beginning and ending of the IC extraction process using a plurality of appropriately located and operably connected position sensors which are activated for starting and stopping and limiting the movement of the DUT board during the execution of the method;

j) stopping the movement of the DUT board over the extraction fingers when misaligned and jammed and unacceptable IC assemblies displace the spring loaded extraction fingers, causing the particular fingers to activate an appropriate located and operably connected extraction finger position sensor;

k) removing the unacceptable IC and resuming the IC removal process;

l) stopping the IC removal process when an unacceptable IC blocks the entry to the storage reservoir and activates an appropriately located and operably connected position sensor and removing said IC and resuming the IC removal process;

m) stopping the IC removal process when a reservoir becomes filled and activates an appropriately located and operably connected position sensor and transferring said IC tubes into suitable IC containers and resuming IC removal process; and n) stopping the IC removal process when the reservoir is not in correct position in relation to the extraction apparatus and activates an appropriately located and operably connected position sensor and correcting said position and resuming operation.

2. An improved, integrated and computer controlled machine for automated handling of multiple integrated circuit assemblies (IC), individually and removably attached to a device under test (DUT) board which distinguishes between and separates the physically acceptable and unacceptable IC and discharges the acceptable IC into a reservoir for delivery into suitable carriers, comprising:

a) suitable means for supporting and holding a detachably mounted and movable indexing table which is to be used in the handling of DUT boards which may contain multiple IC assemblies;

b) a detachably mounted, movable indexing table having means for precisely and accurately holding and securing a DUT board containing multiple IC aligned in parallel rows with the IC insertion sockets on the board and attached IC being exposed and facing outward from the plane of the indexing table;

c) said indexing table having precise and accurate controllable means operably attached thereto for reciprocally moving said table in a plane along the long axis of and parallel to the rows of sockets on the DUT board;

d) an existing IC removal apparatus having an array of parallel fingers parallel and proximate to and aligned with the multiple parallel rows of board sockets and IC, with means for extracting the individual IC from the individual board sockets and with controllable means for mechanically engaging and disengaging the IC removal apparatus from the reciprocal path of the moving indexing table;

e) a movable reservoir proximate to and appropriately aligned with the extraction fingers, having means for receiving, retaining and transferring separated IC to suitable carriers for further processing and for shipping;

f) a plurality of suitable position sensors located appropriately and operably connected with means to sense and control the respective engaged and disengaged positions of the IC removal apparatus with the DUT board and attached IC during the IC removal process;

g) a plurality of suitable position sensors located appropriately and operably connected with means to sense and control the reciprocal travel of the indexing table during the extraction of the IC from the sockets of the DUT board;

h) an existing position sensor appropriately attached and operably connected to an existing IC removal apparatus with means to distinguish between and indicate the physically acceptable and unacceptable IC and notify the indexing table to stop its movement and to permit removal by the operator of the unacceptable IC whenever necessary;

i) a suitable position sensor appropriately attached and operably connected to the IC reservoir with means for indicating a filled condition for the reservoir and for stopping the IC removal process and for notifying the operator to unload the IC into suitable carriers;

j) a suitable position sensor appropriately attached and operably connected to the IC reservoir with means for indicating, if necessary, the presence of IC blocking the entrance of the reservoir and for stopping the IC removal process and for notifying the operator to remove the obstructing IC;

k) a suitable position sensor appropriately attached and operably connected to the IC reservoir with means for indicating the operational status of the reservoir with relation to the IC and the extraction fingers and the indexing table and for stopping the IC removal process and for notifying the operator to adjust and correct the status of the reservoir in relation to the other components, if necessary;

l) suitable means for adjusting, engaging, moving and disengaging the existing IC removal apparatus and the IC reservoir at will and in response to the plurality of appropriate position sensors during operation of the machine system;

m) suitable means for computerized and appropriately programmed control of the said machine and which is operably connected and powered to said machine; and n) suitable means for mounting, supporting and holding said machine and its various components.

3. The integrated and automated machine described in claim 2 wherein;

a) the means for holding and supporting the indexing table is a rectangular, generally box shaped frame, having parallel longer opposing sides and parallel shorter opposing ends, with one longer side being open and having on the opposing parallel longer edges of said longer side, means for holding and guiding matching parallel rails which are attached to matching opposing, parallel edges on one longer side of said indexing table, during the reciprocal movement of said table in the IC removal process;

b) the indexing table is of generally rectangular shape, configured to match the general dimensions of the supporting frame and with parallel opposing edges and surfaces and having a plurality of rails mounted on one surface of said table, in parallel spaced relationship, to match and be movably attached, by suitable means, to said parallel longer edges of said supporting and holding frame;

c) said indexing table has a generally rectangular shaped opening which is configured to removably hold and secure, by suitable means, a DUT board which may hold IC assemblies on one side of said board and in such a manner that the DUT board can be oriented to allow any attached IC assemblies to be removed, in a controlled manner, by an existing IC removal apparatus during the IC removal process;

d) said DUT board holding means includes a flat and generally rectangular shaped cover, configured to match the size of the DUT board and hingably attached to one edge of said indexing table and which may be releasably closed against the side of the DUT board opposing the side holding the IC assemblies, in order to securely hold said DUT board in place on the indexing table during the IC removal process;

e) the reservoir assembly is of standard, commercially available design and of generally rectangular shape and consists of a plurality of matching, planar, parallel rows of slot shaped reservoirs, generally accommodating a variety of IC assemblies and each row capable of holding a finite number of such assemblies, usually approximating the capacity of a standard, commercially available IC carrier tube;

f) the reservoir assembly is adjustably and movably held by a suitable reservoir mounting assembly which mechanically engages, holds and disengages the reservoir assembly, using standard mechanical, pneumatic and electronic components;

g) the indexing table is controllably and reciprocally moved, using a standard drive gear and shaft which is combined with a pneumatically controlled clutch and operably connected to said indexing table and wherein the clutch can be disengaged to permit manual operation of the indexing table whenever necessary; and h) the moving components of the machine are powered by a standard electric motor, combined with a motor controller and by a pneumatic system which operates the clutch, the reservoir movement and which stops the IC removal process when a reservoir is full.

4. The integrated and automated machine described in claim 3 wherein:

a) a loaded DUT board is inverted, with the IC leads facing up, into the sockets and the opposing side of the board is secured to the underside of said indexing table, which then moves the DUT board horizontally and smoothly toward the spring loaded fingers of an existing IC removal apparatus;

b) said extraction fingers are held stationary and proximate to the standard groove in the DUT board socket so that the wedge shaped end of the extractor can fit in the groove in the socket between the IC and the socket in order to separate the IC assembly from the socket and drop it into a down sloping, slot shaped reservoir which stores the IC assemblies for later transfer to standard carrier tubes; and c) a standard light beam position sensor is appropriately located to monitor the relative positions of the array of spring loaded fingers during the IC removal process and is operably connected to the driving mechanism which drives the indexing table containing the DUT board and when a jammed and misaligned and unacceptable IC displaces an affected spring loaded extraction finger the beam will be interrupted and cause the indexing table to stop and the operator to be notified and when the unacceptable IC is removed the light beam circuit will be complete and allow the IC removal process to continue.

5. The integrated and automated machine described in claim 1 wherein:

a) a standard light beam position sensor is appropriately attached and operably connected to the IC reservoir and the reservoir movement means in such a manner as to sense a preselected filled condition when the light beam is interrupted and to stop the IC removal process and disengage the reservoir from the IC extraction apparatus and notify the operator of the filled condition;

b) a standard light beam position sensor is appropriately attached and operably connected to the IC reservoir and to the reservoir movement means in such a manner as to sense the presence of IC blocking the entrance to the reservoir when the light beam is interrupted and to stop the IC removal process and disengage the reservoir from the IC extraction apparatus and notify the operator of the condition;

c) a standard light beam position sensor is appropriately attached and operably connected to the IC reservoir and to the reservoir movement means in such a manner as to sense the engaged and disengaged positions of the reservoir with relation to the IC and the extraction fingers and the indexing table and for stopping the IC removal process and notifying the operator to adjust and correct the status of the reservoir in relation to the other components, if necessary;

d) a plurality of interrupt flat sensors are appropriately attached and operably connected to the indexing plate assembly and the plate assembly movement means in such a manner as to interrupt a light beam position sensor and determine and control beginning and ending positions of the indexing plate during the reciprocal movement of said plate in the IC removal process and control the plate in relation to the position of the reservoir and notify the operator to make any necessary correction and adjustment;

e) a control panel is appropriately and operably attached to the machine and its various operating components which will indicate machine system status and permit operator control of system operation;

f) automatic operation of said machine system is controlled by an appropriately programmed CPU which is operably connected to all relevant components and sensors and to the control panel of the machine and which will control and operate the existing IC removal apparatus as well as the implementing apparatus which completes the machine system; and g) a parallel array of standard IC carrier tubes is placed in matching configuration at the discharge ends of the slot shaped reservoirs, by the operator and the filled reservoirs are discharged by gravity into the empty tubes and the operator replaces the filled tubes with another array of empty tubes.

* * * * *